United States Patent
Yang et al.

(10) Patent No.: US 11,335,631 B2
(45) Date of Patent: May 17, 2022

(54) POWER DELIVERY DEVICE AND METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Sheng-Fan Yang, Hsinchu (TW); Yuan-Hung Lin, Hsinchu (TW); Yu-Cheng Sun, Hsinchu (TW); Hung-Chang Kuo, Hsinchu (TW); Yung-Yang Liang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/994,653

(22) Filed: Aug. 16, 2020

(65) Prior Publication Data
US 2021/0320057 A1 Oct. 14, 2021

(30) Foreign Application Priority Data
Apr. 13, 2020 (TW) .................. 109112396

(51) Int. Cl.
| H01L 23/498 | (2006.01) |
| H01L 23/522 | (2006.01) |
| H01L 23/50 | (2006.01) |
| H01L 23/00 | (2006.01) |

(52) U.S. Cl.
CPC ........ *H01L 23/49816* (2013.01); *H01L 23/50* (2013.01); *H01L 23/5223* (2013.01); *H01L 24/14* (2013.01)

(58) Field of Classification Search
CPC .......... H01L 23/49816; H01L 23/5223; H01L 23/50
See application file for complete search history.

(56) References Cited

U.S. PATENT DOCUMENTS

| 4,322,778 | A | * | 3/1982 | Barbour | ................ | H01L 23/145 |
| | | | | | | 174/254 |
| 5,847,936 | A | * | 12/1998 | Forehand | ............... | H05K 1/114 |
| | | | | | | 361/794 |
| 6,828,666 | B1 | * | 12/2004 | Herrell | ............. | H01L 23/49827 |
| | | | | | | 257/691 |
| 2019/0385941 | A1 | * | 12/2019 | Lai | .......................... | H01L 24/17 |
| 2020/0083779 | A1 | * | 3/2020 | Huang | ...................... | H02P 7/28 |
| 2021/0126333 | A1 | * | 4/2021 | Nakano | ................... | H01P 1/212 |

* cited by examiner

*Primary Examiner* — Phat X Cao
(74) *Attorney, Agent, or Firm* — CKC & Partners Co., LLC

(57) ABSTRACT

A power delivery device includes a printed circuit board (PCB), a package device, and a chip connecting device. The PCB is configured to receive a first reference voltage and a second reference voltage. The package device is coupled to the PCB, and includes a bump array. The chip connecting device is coupled to the bump array of the package device, and configured to output a first supply voltage and a second supply voltage. The bump array includes first bumps and second bumps. The first bumps are configured to transmit the first reference voltage. The second bumps are configured to transmit the second reference voltage. The first bumps and the second bumps are disposed in parallel.

9 Claims, 8 Drawing Sheets

POWER DELIVERY DEVICE AND METHOD

CROSS-REFERENCE TO RELATED APPLICATION

This application claims priority to Taiwan Application Serial Number 109112396, filed Apr. 13, 2020, which is herein incorporated by reference in its entirety.

TECHNICAL FIELD

The present disclosure is related to a delivery device and method, and in particular to a power delivery device and method.

BACKGROUND

As the operation of the circuit device becomes faster, the influence of the high frequency signal on the circuit device becomes more obvious. Thus, the high frequency signal on the power supply of the circuit device becomes more critical.

SUMMARY

One embodiment of the present disclosure is related to a power delivery device including a printed circuit board (PCB), a package device, and a chip connecting device. The PCB is configured to receive a first reference voltage and a second reference voltage. The package device is coupled to the PCB, and includes a bump array. The chip connecting device is coupled to the bump array of the package device, and configured to output a first supply voltage and a second supply voltage. The bump array includes first bumps and second bumps. The first bumps are configured to transmit the first reference voltage. The second bumps are configured to transmit the second reference voltage. The first bumps and the second bumps are disposed in parallel.

In some embodiments, the power delivery device further includes a plurality of conductive balls, and the plurality of conductive balls are coupled between the PCB and the package device. The PCB includes a first via, a second via hole, and a capacitor device. The first via is coupled to the first conductive ball of the plurality of conductive balls, and is configured to transmit the first reference voltage to the first conductive ball. The second via is coupled to the second conductive ball of the plurality of conductive balls, and is configured to transmit the second reference voltage to the second conductive ball. The capacitor device is coupled between the first via and the second via.

In some embodiments, the capacitor device includes multiple capacitors disposed in parallel.

In some embodiments, the PCB includes a first conductive plate and a second conductive plate. The first conductive plate is configured to receive the first reference voltage. The second conductive plate is configured to receive the second reference voltage. The first conductive plate is disposed on the bottom surface of the PTB. The second conductive plate is disposed between the bottom surface and the top surface of the PCB, and substantially overlaps the first conductive plate. The first conductive plate and the second conductive plate form a first parallel plate capacitor.

In some embodiments, the PCB further includes a first ferrite bead and a second ferrite bead. The first ferrite bead is coupled to the first conductive plate, and the first conductive plate receives the first reference voltage through the first ferrite bead. The second ferrite bead is coupled to the second conductive plate, and the second conductive plate receives the second reference voltage through the second ferrite bead.

In some embodiments, the PCB further includes a third conductive plate, a fourth conductive plate, a third ferrite bead, a fourth ferrite bead, a first reference conductive plate, and a second reference conductive plate. The third conductive plate is configured to receive the first reference voltage. The fourth conductive plate is configured to receive the second reference voltage. The third ferrite bead is coupled to the third conductive plate, and the third conductive plate receives the first reference voltage through the third ferrite bead. The fourth ferrite bead is coupled to the fourth conductive plate, and the fourth conductive plate receives the second reference voltage through the fourth ferrite bead. The first reference conductive plate is coupled to the first conductive plate and the third conductive plate through the first ferrite bead and the third ferrite bead, respectively. The second reference conductive plate is coupled to the second conductive plate and the fourth conductive plate through the second ferrite bead and the fourth ferrite bead, respectively. The third conductive plate is disposed on the bottom surface of the PCB. The fourth conductive plate is disposed between the bottom surface and the top surface of the PCB, and substantially overlaps the third conductive plate. The third conductive plate and the fourth conductive plate form a second parallel plate capacitor. The first reference conductive plate is disposed on the bottom surface of the PCB. The second reference conductive plate is disposed between the bottom surface and the top surface of the PCB, and substantially overlaps the first reference conductive plate. The first reference conductive plate and the second reference conductive form a third parallel plate capacitor.

One embodiment of the present disclosure is related to a power delivery method, including: transmitting at least one reference voltage to a power delivery device through a power supply device; receiving, by a printed circuit board (PCB) in the power delivery device, the at least one reference voltage; transmitting, by the PCB, the at least one reference voltage to at least one conductive ball; receiving, by the package device, the at least one reference voltage through the at least one conductive ball and transmitting, by the package device, the at least one reference voltage to a chip connecting device; and outputting, by the chip connecting device, at least one supply voltage to a circuit device based on the received at least one reference voltage.

In some embodiments, wherein transmitting, by the PCB, the at least one reference voltage to at least one conductive ball includes: transmitting, by the PCB, the at least one reference voltage to at least one conductive ball through at least one via in the PCB.

In some embodiments, transmitting, by the package device, the at least one reference voltage to a chip connecting device includes: transmitting, by the package device, the at least one reference voltage to the chip connecting device through a bump array.

In some embodiments, the power delivery method further includes: decoupling, by at least one capacitor device in the PCB, the at least one reference voltage.

Based on the above, the power delivery device and the power delivery method provided in some embodiments of the present application may provide a more stable supply voltage for the circuit device, to reduce the high frequency signal in the supply voltage, so as to reduce the influence of the high frequency signal on the circuit device.

BRIEF DESCRIPTION OF THE DRAWINGS

The present disclosure may be fully understood by reading the following detailed description of the embodiments with reference to the drawings as follows.

DETAILED DESCRIPTION

Figure 1:
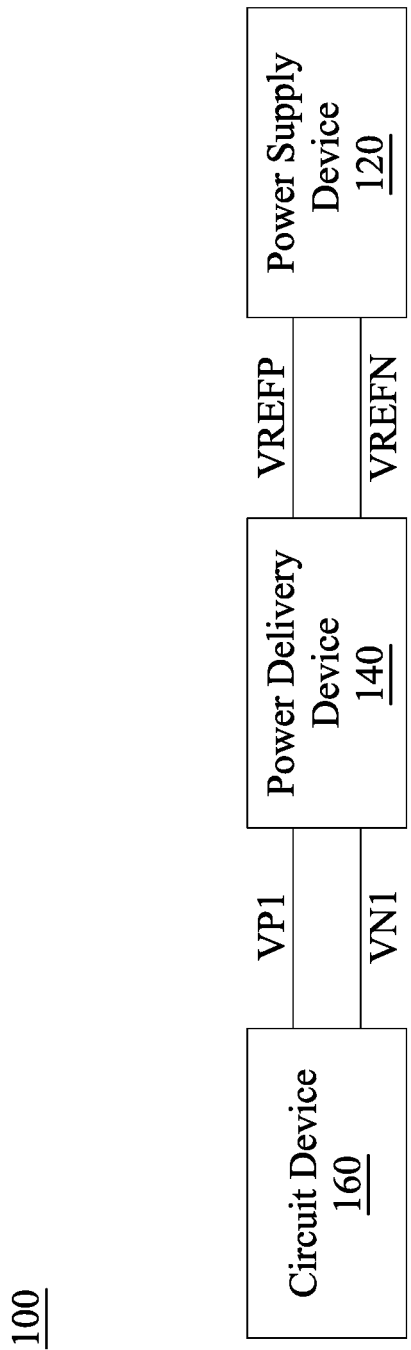
FIG. 1 is a schematic diagram of the circuitry depicted according to some embodiments of the present disclosure.

Reference will now be made in detail to the accompanying drawings and the following embodiments. However, the provided embodiments are not used to limit the scope covered by the present application, and the description of the structure operations are not used to limit the execution sequence. Any structures recombined by elements and any devices with equivalent effect are also covered by the present application.

In addition, as used herein, "coupled" and "connected" may be used to indicate that two or more elements physical or electrical contact with each other directly or indirectly, and may also be used to indicate that two or more elements cooperate or interact with each other.

The terms "first," "second," "third," and the likes herein are used to describe various elements. However, these elements are not be limited by these terms. These terms are only used to identify a single element. Thus, a first element below may also be referred to as a second element without departing from the spirit of the present application.

The term "circuitry" herein may indicate a single system formed with one or more circuits. The term "circuit" may indicate an object, which is formed with one or more transistors and/or one or more active/passive elements based on a specific arrangement, for processing signals.

As used herein, "about", "substantially" or "equivalent" shall generally mean within 20 percent, preferably within 10 percent, and more preferably within 5 percent of a given value or range. Numerical quantities given herein are approximate, meaning that the term "about", "substantially" or "equivalent" can be inferred if not expressly stated.

For ease of understanding, similar elements in the figures below will be designated with the same reference numerals.

Reference is made to FIG. 1. FIG. 1 is a schematic diagram of the circuitry 100 depicted according to some embodiments of the present disclosure. As shown in FIG. 1, the circuitry 100 includes a power supply device 120, a power delivery device 140, and a circuit device 160. The power supply device 120 is coupled to the power delivery device 140, and the power delivery device 140 is coupled to the circuit device 160.

In some embodiments, the power supply device 120 is configured to provide the power for the operation of the circuit device 160. The power supply device 120 is configured to output a reference voltage VREFP and a reference voltage VREFN to the power delivery device 140. In some embodiments, the power delivery device 140 is configured to receive the reference voltage VREFP and the reference voltage VREFN, and output a supply voltage VP1 and a supply voltage VN1 to the circuit device 160. In other words, the power delivery device 140 is configured to transmit the power provided by the power supply device 120 to the circuit device 160 for operation.

In some embodiments, the reference voltage VREFP is substantially the same with the supply voltage VP1, and the reference voltage VREFN is substantially the same with the supply voltage VN1. In some embodiments, the reference voltage VREFP has the system high level. In some embodiments, the reference voltage VREFN has the system ground level. In some embodiments, the high frequency signals in the supply voltage VP1 are substantially less than the high frequency signals in the reference voltage VREFP, and the high frequency signals in the supply voltage VN1 are substantially less than the high frequency signals in the reference voltage VREFN. In other words, the power delivery device 140 is configured to reduce high frequency signals in the reference voltage VREFP and the reference voltage VREFN.

In some embodiments, the circuit device 160 is an analog-to-digital converter (ADC) circuit. In some embodiments, the power delivery device 140 is configured to increase the signal noise ratio (SNR) of the circuitry 100.

Figure 2:
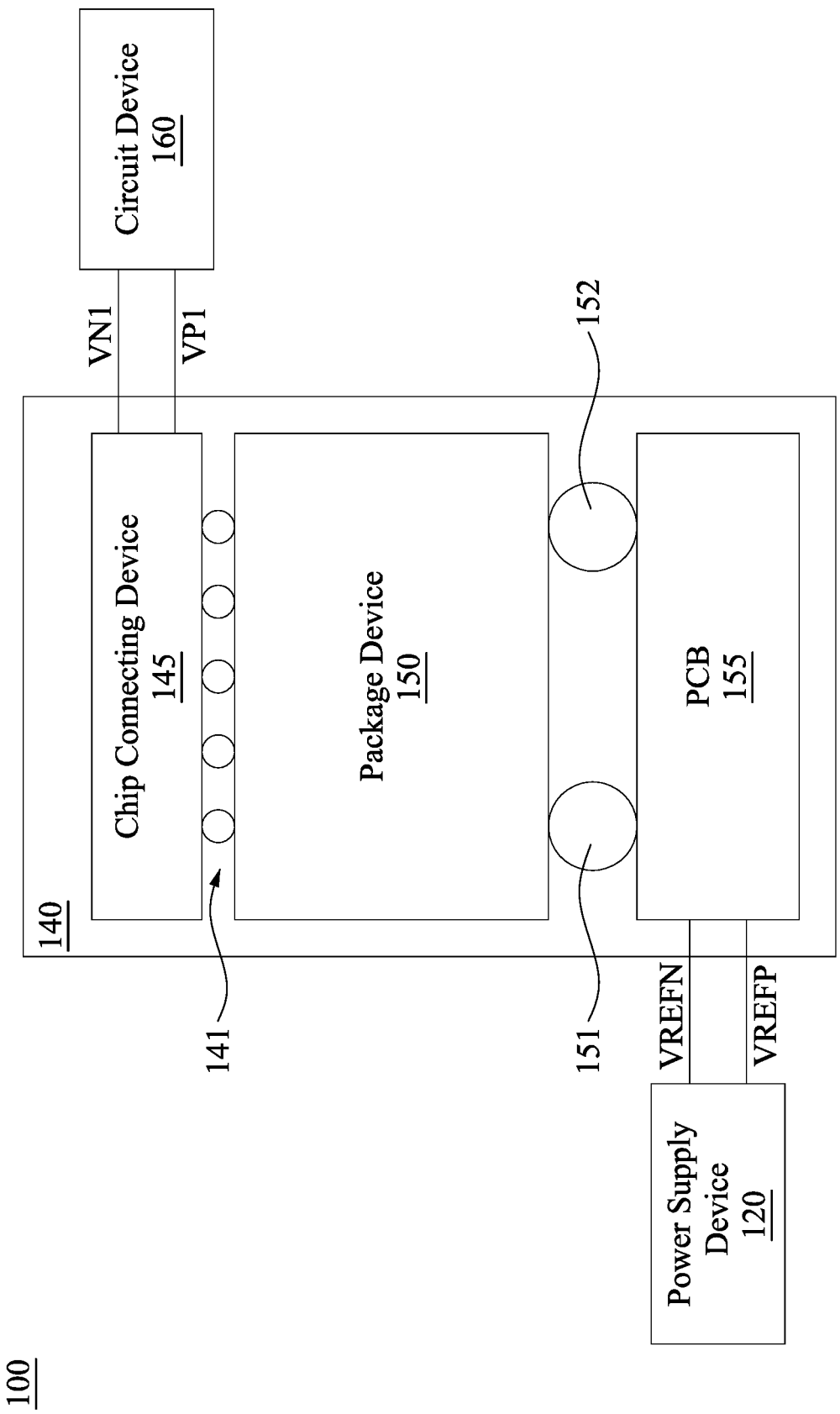
FIG. 2 is a schematic diagram of the circuitry depicted according to some embodiments of the present disclosure.

Reference is made to FIG. 2. FIG. 2 is a schematic diagram of the circuitry 100 depicted according to some embodiments of the present disclosure. Compared with FIG. 1, the circuitry 100 shown in FIG. 2 further includes the detailed structure of the power delivery device 140. As shown in FIG. 2, the circuitry 100 includes a power supply device 120, a power delivery device 140, and a circuit device 160, wherein the power delivery device 140 includes a chip connecting device 145, a package device 150, a conductive ball 151, a conductive ball 152, and a printed circuit board (PCB) 155.

As shown in FIG. 2, the power supply device 120 is coupled to the PCB 155 in the power delivery device 140, the PCB 155 is coupled to the package device 150 through the conductive ball 151 and the conductive ball 152, the package device 150 is coupled to the chip connecting device 145, and the chip connecting device 145 is then coupled to the circuit device 160.

In some embodiments, the package device 150 includes a bump array 141 disposed on a surface of the package device 150, and the package device 150 is coupled to the chip connecting device 145 through the bump array 141. In some embodiments, the bump array 141 includes a plurality of bumps, such as the bumps 141a-141h shown in FIG. 3. In some embodiments, the bump is composed by a conductor, and the material of the aforementioned conductor may be metal conductive materials, such as gold, copper, or the like.

In some embodiments, the PCB 155 is configured to receive the reference voltage VREFP and the reference voltage VREFN provided by the power supply device 120, and transmit the reference voltage VREFP and the reference voltage VREFN to the conductive ball 151 and the conductive ball 152, respectively.

In some embodiments, the conductive ball 151 and the conductive ball 152 are configured to transmit the reference voltage VREFP and the reference voltage VREFN to the package device 150, respectively.

In some embodiments, the package device 150 is configured to receive the reference voltage VREFP and the reference voltage VREFN transmitted by the conductive ball 151 and the conductive ball 152. The package device 150 is further configured to transmit the reference voltage VREFP and the reference voltage VREFN to the chip connecting device 145 through the bump array 141. In some embodiments, the bump array 141 contacts the chip connecting device 145 directly.

In some embodiments, the chip connecting device 145 is configured to receive the reference voltage VREFP and the reference voltage VREFN transmitted by the bump array 141, and output the supply voltage VP1 and the supply voltage VN1 to the circuit device 160 based on the reference voltage VREFP and the reference voltage VREFN, respectively.

In some embodiments, the circuit device 160 includes a circuit chip. In some embodiments, the chip connecting device 145 and the circuit device 160 include different portions of one circuit chip. In other words, the chip connecting device 145 is a connecting device on the circuit chip for receiving the power. In some embodiments, the bump array 141 is disposed based on the pins of the circuit chip of the circuit device 160, and is coupled to the pins of the chip connecting device 145 corresponding to the pins of the circuit chip.

The configuration of the power delivery device 140 described above is only for exemplary purposes. Various configurations of power delivery device 140 are within the consideration and the scope of the present disclosure.

Figure 3:
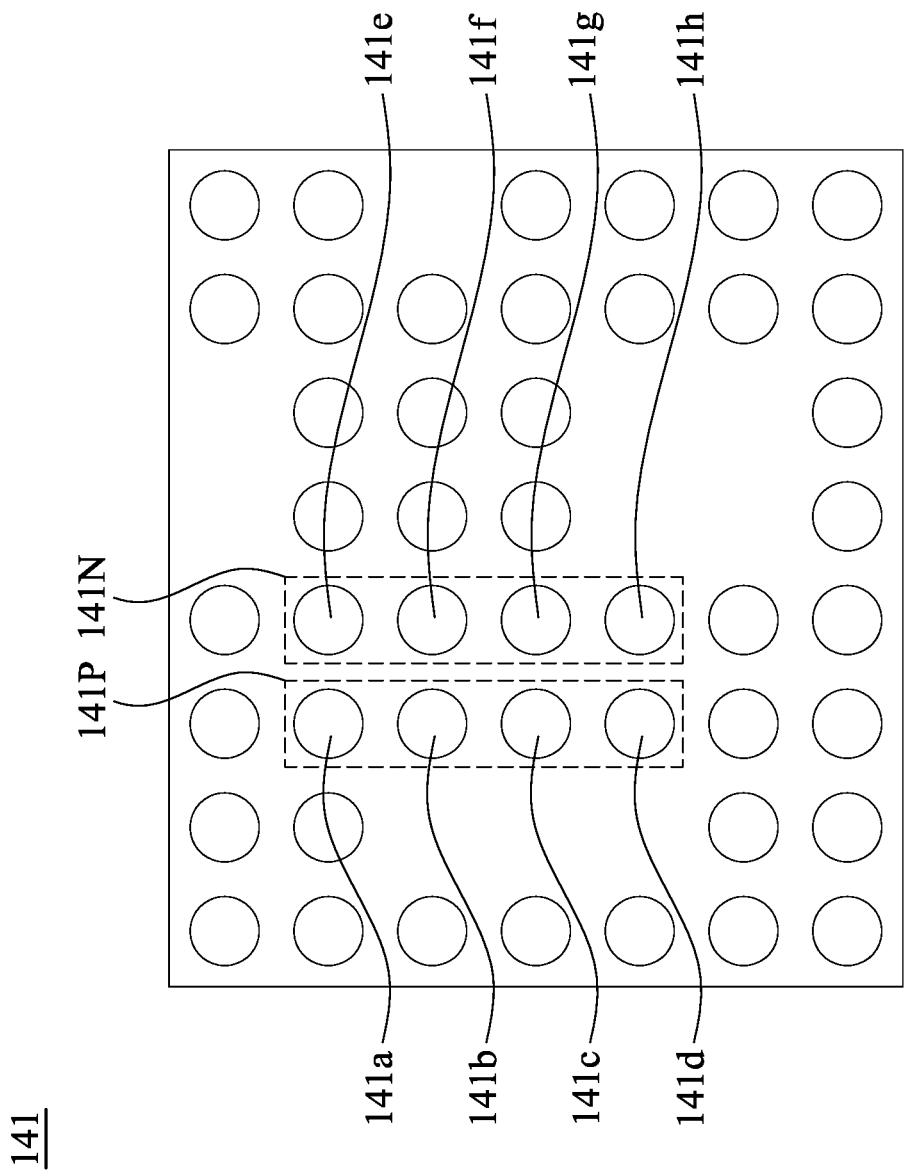
FIG. 3 is a top schematic view of the bump array depicted in FIG. 2 according to some embodiments of the present disclosure.

Reference is made to FIG. 3. FIG. 3 is a top schematic view of the bump array 141 depicted in FIG. 2 according to some embodiments of the present disclosure. As shown in FIG. 3, the bump array 141 includes a bump area 141P and a bump area 141N.

In some embodiments, the bump area 141P includes a bump 141*a*, a bump 141*b*, a bump 141*c*, and a bump 141*d*. The bump area 141P is configured to transmit the reference voltage VREFP. In some embodiments, the bump area 141N includes a bump 141*e*, a bump 141*f*, a bump 141*g*, and a bump 141*h*. The bump area 141N is configured to transmit the reference voltage the VREFN.

In some embodiments, the bump area 141P and the bump area 141N are disposed in parallel. As shown in FIG. 3, the bumps 141*a*-141*d* in the bump area 141P and the bumps 141*e*-141*h* in the bump area 141N are disposed in parallel substantially. In some embodiments, the bumps 141*a*-141*d* in the bump area 141P and the bumps 141*e*-141*h* in the bump area 141N are disposed at least in part in parallel substantially.

In some embodiments, the bump area 141P composed of the bumps 141*a*-141*d* and the bump area 141N composed of the bumps 141*e*-141*h* are closed areas, as in the dashed box shown in FIG. 3. The bump area 141P and the bump area 141N are not staggered with each other.

In some embodiments, the bump array 141 further includes a connecting conductor (not shown), wherein the connecting conductor is configured to electrically couple the bumps 141*a*-141*d* with each other, and electrically couple the bump 141*e*-141*h* with each other, such that the bumps 141*a*-141*d* have the same level, and the bumps 141*e*-141*h* have the same level.

In some practices, the plurality of bumps for transmitting the reference voltage VREFP and the plurality of bumps for transmitting the reference voltage VREFN are staggered with each other, such that the connecting conductor coupled electrically to the plurality of bumps for transmitting the reference voltage VREFP and the connecting conductor coupled electrically to the plurality of bumps for transmitting the reference voltage VREFN are staggered or surrounded with each other. Thus, the equivalent inductance value between the connecting conductor coupled electrically to the plurality of bumps for transmitting the reference voltage VREFP and the connecting conductor coupled electrically to the plurality of bumps for transmitting the reference voltage VREFN is higher.

Compared with the approach described above, in the bump array 141 provided in the present disclosure, the bumps 141*a*-141*d* and the bumps 141*e*-141*h* are disposed in parallel, such that the connecting conductor coupled electrically to the bumps 141*a*-141*d* and the connecting conductor coupled electrically to the bumps 141*e*-141*h* are separated from each other. Thus, the equivalent inductance value between the two groups of the bumps (i.e. The bump area 141P and the bump area 141N) is lower.

The bump array 141 described above is for illustrative purposes only. Various bump arrays 141 are within the consideration and scope of the present disclosure. For example, in various embodiments, the bump area 141P and the bump area 141N each may include more or less than four bumps. For example, in some embodiments, the bumps in the bump area 141P and the bump area 141N are disposed in other arrangements, and the bump area 141P and the bump area 141N are separated from each other.

Figure 4:
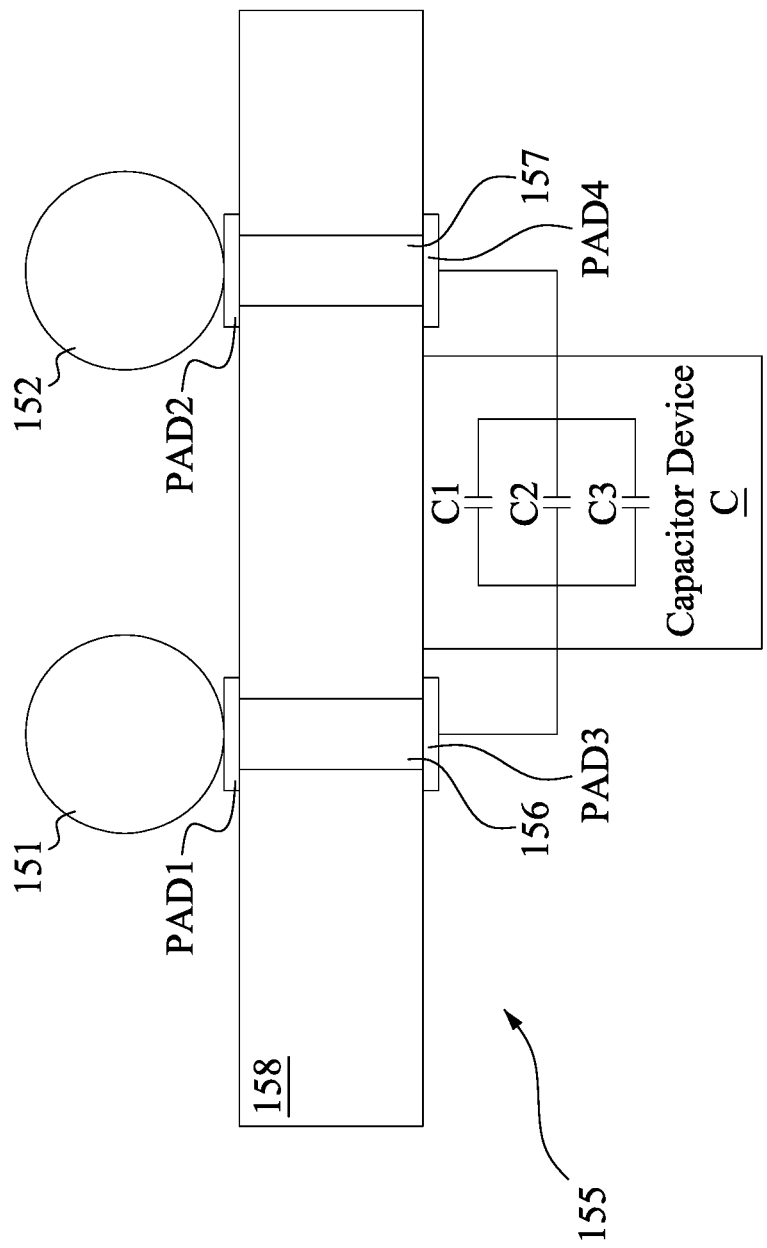
FIG. 4 is a schematic diagram of the PCB depicted in FIG. 2 according to some embodiments of the present disclosure.

Reference is made to FIG. 4. FIG. 4 is a schematic diagram of the PCB 155 depicted in FIG. 2 according to some embodiments of the present disclosure. As shown in FIG. 4, the PCB 155 includes a substrate 158, a via 156, a via 157, and a capacitor device C, wherein the via 156 and via 157 pass through the substrate 158 and are coupled to the conductive ball 151 and the conductive ball 152, respectively.

In some embodiments, the vias 156-157 are through vias, and are configured to conduct the reference voltage VREFP and the reference voltage VREFN to the both sides of the PCB 155.

In some embodiments, the via 156 is configured to transmit the reference voltage VREFP to the conductive ball 151, and the via 157 is configured to transmit the reference voltage VREFN to the conductive ball 152. In some embodiments, the conductive ball 151 and the conductive ball 152 are coupled to the PCB 155 through a pad PAD1 and a pad PAD2, respectively. Accordingly, the via 156 and the via 157 are configured to transmit the reference voltage VREFP and the reference voltage VREFN to the conductive ball 151 and the conductive ball 152 through the pad PAD1 and the pad PAD2, respectively.

In some embodiments, the capacitor device C is coupled between the via 156 and via 157. In some embodiments, the capacitor device C is coupled between the via 156 and via 157 through the pad PAD3 and the pad PAD4. In some embodiments, the capacitor device C is disposed on the shortest path between the via 156 and the via 157, such that the capacitance value between the via 156 and via 157 corresponds to the capacitor device C. In other words, one end of the capacitor device C is coupled to the via 156 directly, and the other end of the capacitor device C is coupled to the via 157 directly. In some embodiments, as shown in FIG. 4, the capacitor device C is disposed beneath the via 156 and the via 157 and adjacent to the pad PAD3 and pad PAD4 directly, such that the capacitor device C is located in the shortest path between the via 156 and the via 157.

In some embodiments, the capacitor device C includes a capacitor C1, a capacitor C2, and a capacitor C3, wherein the capacitor C1, the capacitor C2, and the capacitor C3 are disposed in parallel. The capacitor device C is configured to decouple the high frequency signals between the reference voltages VREFP and the reference voltage VREFN. In some embodiments, the reference voltage VREFP and the reference voltage VREFN are DC voltages, such that the high frequency signals between the reference voltage VREFP and the reference voltage VREFN are the noise. In some embodiments, the noise described above is the noise generated by the power supply device 120 and/or the power delivery device 140. For example, the equivalent inductance of the elements in the power delivery device 140 generates a voltage change based on the time-variant of the current transmitted. The voltage change corresponding to the change of the DC voltage is considered as the noise. In other embodiments, the capacitor device C further includes an idle capacitor (not shown). The idle capacitor is used as a reserve capacitor.

The configuration of the PCB 155 described above is for illustrative purposes only. Various configurations of the PCB 155 are within the consideration and scope of the present disclosure. For example, in various embodiments, the PCB 155 includes more capacitors disposed between the vias 156-157.

Figure 5:
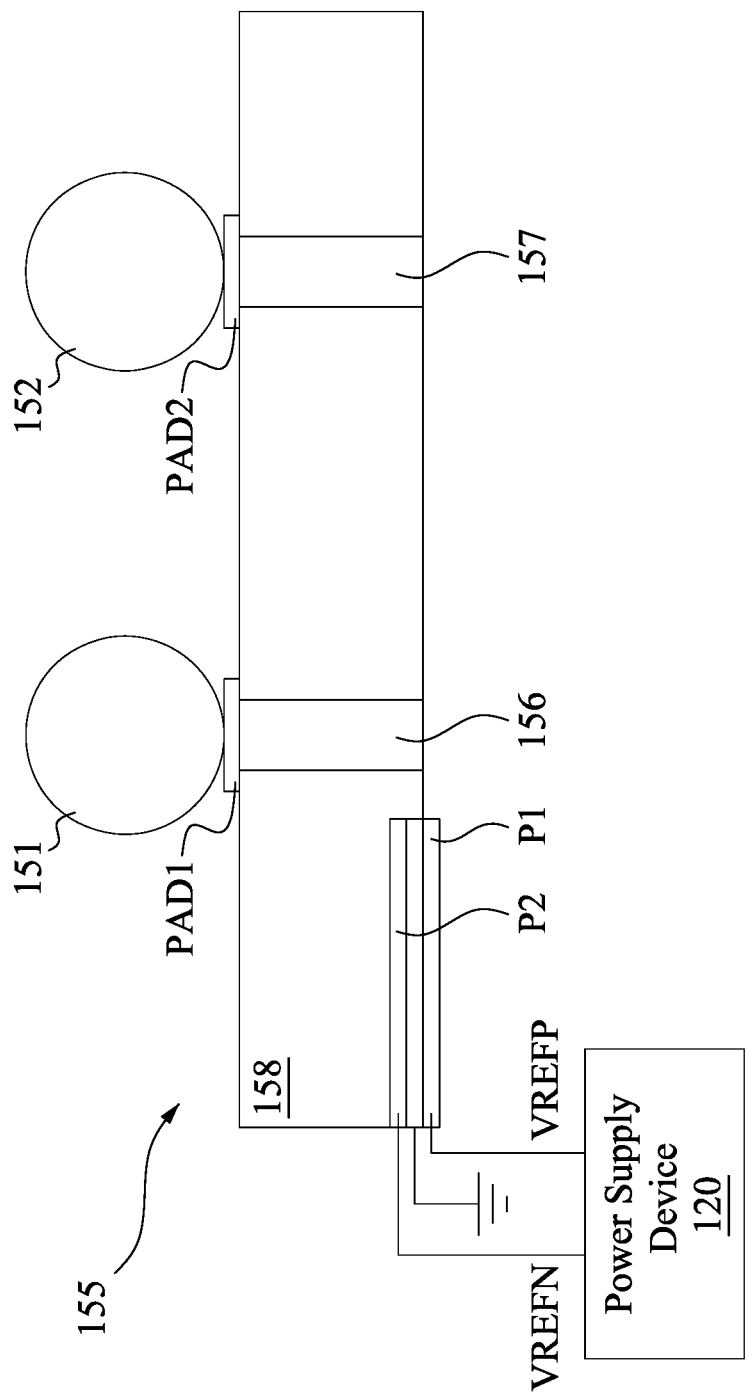
FIG. 5 is a schematic diagram of the PCB depicted in FIG. 2 according to other embodiments of the present disclosure.

Reference is made to FIG. 5. FIG. 5 is a schematic diagram of the PCB 155 depicted in FIG. 2 according to other embodiments of the present disclosure. As shown in FIG. 5, the PCB 155 includes a via 156, a via 157, a conductive plate P1, and a conductive plate P2. The via 156 and the via 157 are similar with the via 156 and via 157 in FIG. 4, and thus the descriptions are omitted herein.

In some embodiments, the conductive plate P1 is disposed on the outside of a surface of the PCB 155, and the conductive plate P2 is disposed on the inside of the same surface of the PCB 155 with the conductive plate P1. In some embodiments, a parallel plate capacitor is formed between the conductive plate P1 and the conductive plate P2. In other words, the conductive plate P1 is not in direct contact with the conductive plate P2, and there is a distance between the conductive plates P1 and the conductive plate P2 (as shown in FIG. 5). In some embodiments, the size of the conductive plate P1 and the size of the conductive plate P2 are substantially the same. In some embodiments, the conductive plate P1 substantially overlaps the conductive plate P2.

In some embodiments, the conductive plate P1 is configured to receive the reference voltage VREFP, and transmit the reference voltage VREFP to the via 156. In some embodiments, the conductive plate P2 is configured to receive the reference voltage VREFN, and transmit the reference voltage VREFN to the via 157. In some embodiments, the voltage between the conductive plate P1 and the conductive plate P2 is at the system ground level.

In some embodiments, the parallel plate capacitor form between the conductive plate P1 and the conductive plate P2 is configured to decouple the high frequency signals between the reference voltages VREFP and the reference voltage VREFN.

Figure 6:
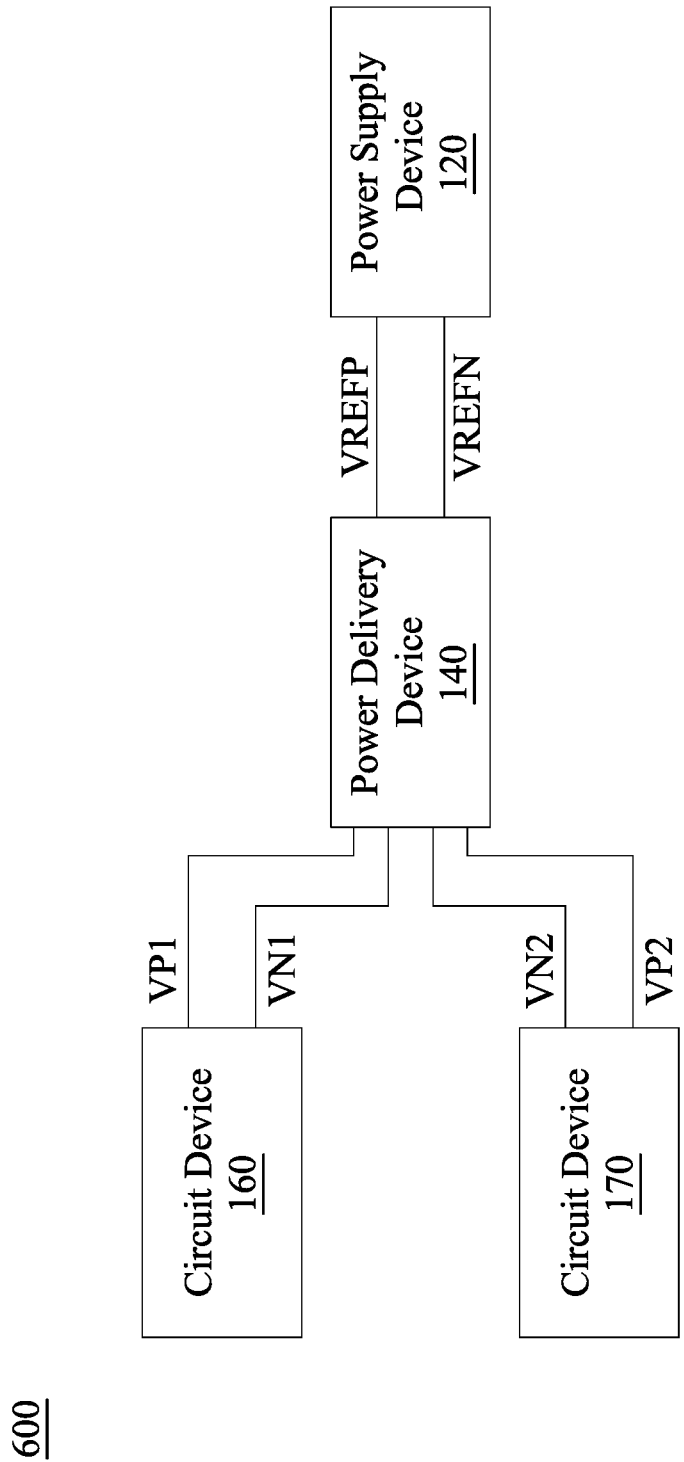
FIG. 6 is a schematic diagram of the circuitry depicted according to other embodiments of the present disclosure.

Reference is made to FIG. 6. FIG. 6 is a schematic diagram of the circuitry 600 depicted according to other embodiments of the present disclosure. The circuitry 600 is similar with the circuitry 100 shown in FIG. 1. As shown in FIG. 6, the circuitry 600 includes a power supply device 120, a power delivery device 140, and a circuit device 160. Compared with the circuitry 100, the circuitry 600 further includes the circuit device 170. The power supply device 120 is coupled to the power delivery device 140, and the power delivery device 140 is coupled to the circuit device 160 and the circuit device 170.

In some embodiments, the power supply device 120 is configured to provide the power for the operation of the circuit device 160 and the circuit device 170. The power supply device 120 is configured to output a reference voltage VREFP and a reference voltage VREFN to the power delivery device 140. In some embodiments, the power delivery device 140 is configured to receive the reference voltage VREFP and the reference voltage VREFN, output a supply voltage VP1 and a supply voltage VN1 to the circuit device 160, and output a supply voltage VP2 and a supply voltage VN2 to the circuit device 170. In other words, the power delivery device 140 is configured to transmit the power provided by the power supply device 120 to the circuit device 160-170 for operation.

The circuitry 600 described above is for illustrative purposes only. Various circuitry 600 are within the consideration and the scope of the present disclosure. For example, in various embodiments, the power delivery device 140 in the circuitry 600 is configured to provide different supply voltages to different circuit devices.

In some embodiments, the power delivery device 140 shown in FIG. 6 includes the chip connecting device 145, the package device 150, and the PCB 155 described above. In some embodiments, the PCB 155 may be the PCB shown in FIG. 7.

Figure 7:
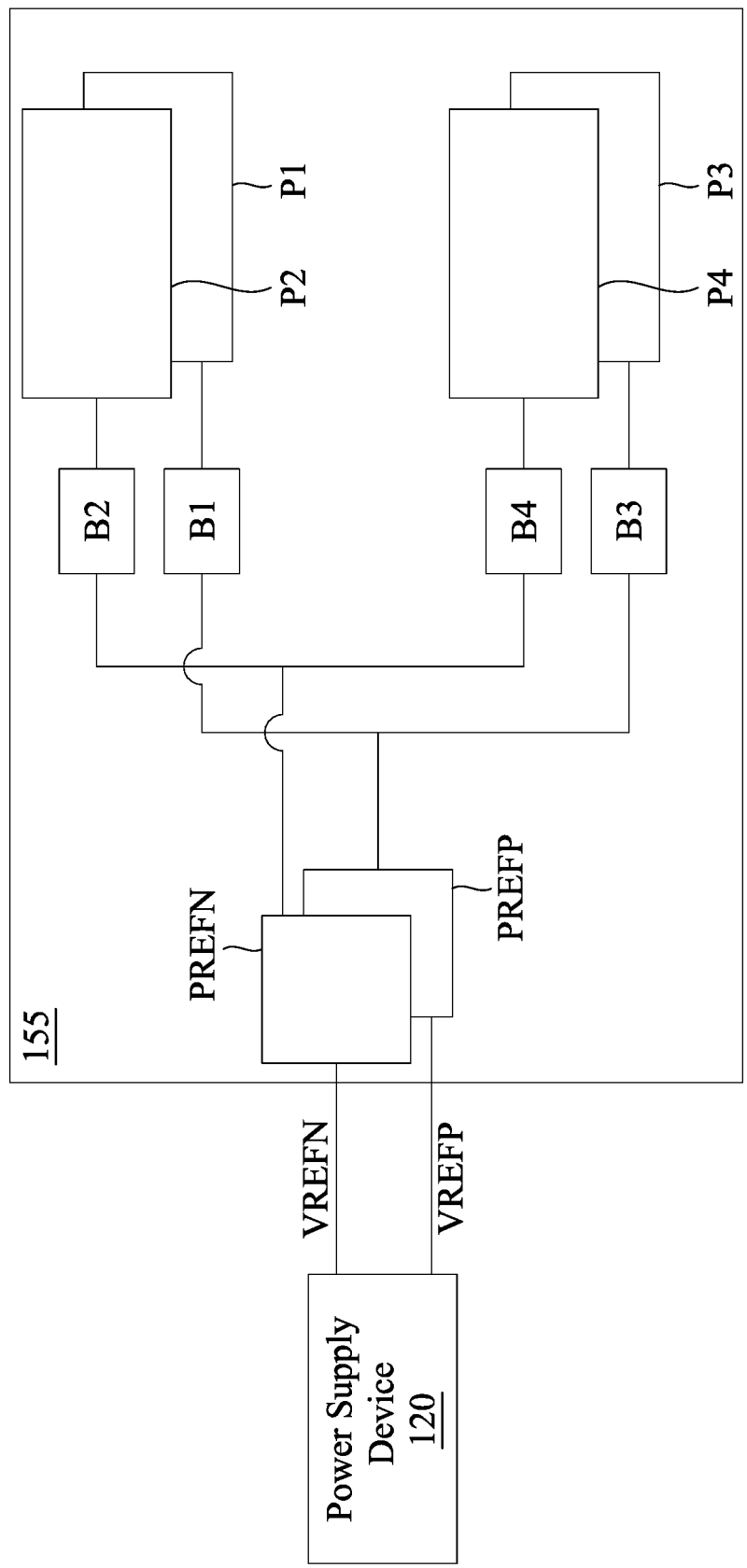
FIG. 7 is a schematic diagram of the PCB depicted according to other embodiments of the present disclosure.

FIG. 7 is a schematic diagram of the PCB 155 depicted according to other embodiments of the present disclosure. As shown in FIG. 7, the PCB 155 includes a conductive plate P1, a conductive plate P2, a conductive plate P3, a conductive plate P4, a conductive plate PREFP, a conductive plate PREFN, a ferrite bead B1, a ferrite bead B2, a ferrite bead B3, and a ferrite bead B4. The conductive plate PREFP is coupled to the conductive plate P1 and the conductive plate P3 through the ferrite bead B1 and the ferrite bead B3, respectively, and the conductive plate PREFN is coupled to the conductive plate P2 and the conductive plate P4 through the ferrite bead B2 and the ferrite bead B4, respectively.

In some embodiments, the conductive plate PREFP is configured to receive the reference voltage VREFP, and the conductive plate PREFN is configured to receive the reference voltage VREFN. In some embodiments, the conductive plate PREFP is disposed on the outside of a surface of the PCB 155, and the conductive plate PREFN is disposed on the inside of the same surface with the conductive plate PREFP. In some embodiments, a parallel plate capacitor is formed between the conductive plate PREFP and the conductive plate PREFN. In other words, the conductive plate PREFP is not in direct contact with the conductive plate PREFN, and there is a distance between the conductive plates PREFP and the conductive plate PREFN. In some embodiments, the size of the conductive plate PREFP and the size of the conductive plate PREFN are substantially the same. In some embodiments, the conductive plate PREFP substantially overlaps the conductive plate PREFN.

In some embodiments, the parallel plate capacitor form between the conductive plate PREFP and the conductive plate PREFN is configured to decouple the high frequency signals between the reference voltages VREFP and the reference voltage VREFN.

In some embodiments, the ferrite beads B1-B4 are choke coils, which are equivalent to inductance elements, and are configured to suppress high frequency signals. The conductive plate PREFP is coupled to the conductive plate P1 and the conductive plate P3 through the ferrite bead B1 and the ferrite bead B3, respectively, and the conductive plate PREFN is coupled to the conductive plate P2 and the conductive plate P4 through the ferrite bead B2 and the ferrite bead B4, respectively.

In some embodiments, the conductive plate PREFP is configured to transmit the reference voltage VREFP to the conductive plate P1 and the conductive plate P3 through the ferrite bead B1 and the ferrite bead B3, respectively, and the conductive plate PREFN is configured to transmit the reference voltage VREFN to the conductive plate P2 and the conductive plate P4 through the ferrite bead B2 and the ferrite bead B4, respectively.

In some embodiments, if the high frequency signals exist on the reference voltage VREFP on the conductive plate PREFP, the ferrite bead B1 and the ferrite bead B3 are configured to suppress the transmission of the high frequency signals to the conductive plate P1 and the conductive plate P3. Correspondingly, if the high frequency signals exist on the reference voltage VREFN on the conductive plate PREFN, the ferrite bead B2 and the ferrite bead B4 are configured to suppress the transmission of the high frequency signals to the conductive plate P2 and the conductive plate P4. In other words, the ferrite beads B1-B4 are configured to block the transmission of the high frequency signals on the conductive plate PREFP and the conductive plate PREFN to the conductive plates P1-P4.

In some embodiments, the conductive plate P1 and the conductive plate P3 receive the reference voltage VREFP through the ferrite bead B1 and the ferrite bead B3, respectively, and the conductive plate P2 and the conductive plate P4 receive the reference voltage VREFN through the ferrite bead B2 and the ferrite bead B4, respectively. In some embodiments, the conductive plate P1 and the conductive plate P3 are disposed on the bottom surface of the PCB 155, and the conductive plate P2 and the conductive plate P4 are disposed between the bottom surface and the top surface of the PCB 155. In some embodiments, a parallel plate capacitor is formed between the conductive plate P1 and the conductive plate P2, and a parallel plate capacitor is formed between the conductive plate P3 and the conductive plate P4. In other words, the conductive plate P1 is not in direct contact with the conductive plate P2, and there is a distance between the conductive plates P1 and the conductive plate P2. In addition, the conductive plate P3 is not in direct contact with the conductive plate P4, and there is a distance between the conductive plates P3 and the conductive plate P4. In some embodiments, the size of the conductive plate P1 and the size of the conductive plate P2 are substantially the same, and the size of the conductive plate P3 and the size of the conductive plate P4 are substantially the same. In some embodiments, the conductive plate P1 substantially overlaps the conductive plate P2, and the conductive plate P3 substantially overlaps the conductive plate P4.

In some embodiments, the voltage between the conductive plate P1 and the conductive plate P2 has the system ground level, the voltage between the conductive plate P3 and the conductive plate P4 has the system ground level, and the voltage between the conductive plate PREFP and the conductive plate PREFN has the system ground level.

In some embodiments, the conductive plate P1 and the conductive plate P2 in the PCB 155 in FIG. 7 are configured to transmit the reference voltage VREFP and the reference voltage VREFN, such that the power delivery device 140 outputs the supply voltage VP1 and the supply voltage VN1 based on the reference voltage VREFP and the reference voltage VREFN transmitted by the conductive plate P1 and the conductive plate P2. Correspondingly, the conductive plate P3 and the conductive plate P4 in the PCB 155 are configured to transmit the reference voltage VREFP and the reference voltage VREFN, such that the power delivery device 140 outputs the supply voltage VP2 and the supply voltage VN2 based on the reference voltage VREFP and the reference voltage VREFN transmitted by the conductive plate P3 and the conductive plate P4.

The configuration of the PCB 155 in FIG. 7 is for illustrative purposes only. Various configurations of the PCB 155 are within the consideration and scope of the present disclosure. For example, in various embodiments, the PCB 155 further includes a plurality of conductive plates, such that the power delivery device 140 may be configured to transmit different supply voltages.

Figure 8:
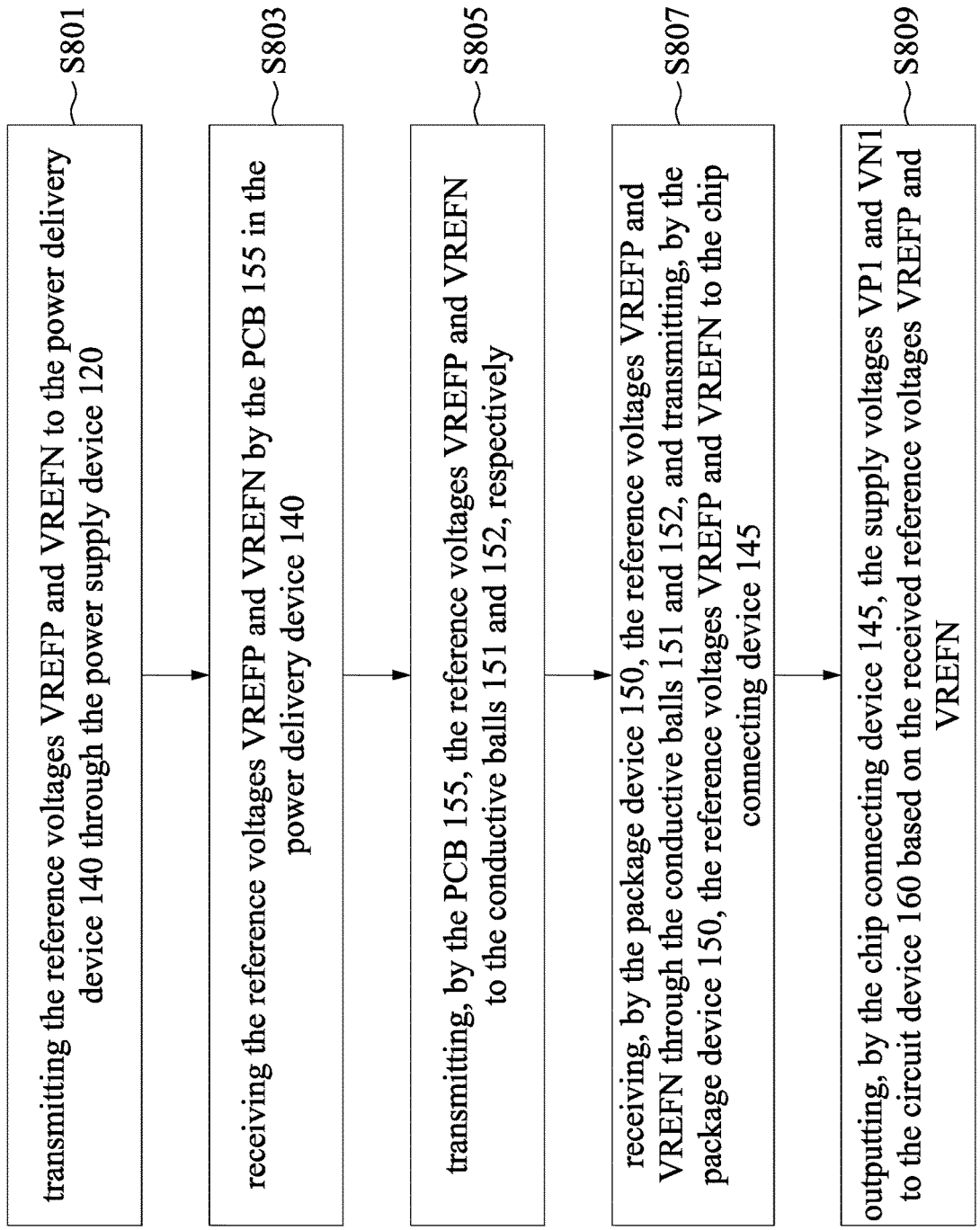
FIG. 8 is a flowchart of the power delivery method depicted according to some embodiments of the present disclosure.

FIG. 8 is a flowchart of the power delivery method 800 depicted according to some embodiments of the present disclosure. As shown in FIG. 8, the power delivery method 800 includes operations S801, S803, S805, S807, and S809. For the sake of clarity and convenience of description, the following power delivery method 800 is described with the circuitry 100 shown in FIG. 2, but the power delivery method 800 is not limited to the circuitry 100 shown in FIG. 2. The power delivery method 800 may be applied to any circuitry within the consideration and scope of the present disclosure.

In the operation S801, the reference voltage VREFP and the reference voltage VREFN are transmitted to the power delivery device 140 through the power supply device 120.

Then, in the operation S803, the PCB 155 in the power delivery device 140 receives the reference voltages VREFP and VREFN. In some embodiments, the PCB 155 may receive the reference voltages VREFP and VREFN through the conductive plates P1 and P2 in FIG. 5. In some embodiments, the decoupling operation on the noise between the reference voltage VREFP and the reference voltage VREFN is performed by the capacitor device C of the PCB 155 (shown in FIG. 4).

Then, in the operation S805, the PCB 155 transmits the reference voltage VREFP and the reference voltage VREFN to the conductive ball 151 and the conductive ball 152, respectively. In some embodiments, the PCB 155 may transmit the reference voltage VREFP and the reference voltage VREFN to the conductive ball 151 and the conductive ball 152 through the via 156 and the via 157 in FIG. 5, respectively.

Then, in the operation S807, the package device 150 receives the reference voltage VREFP and the reference voltage VREFN through the conductive ball 151 and the conductive ball 152, and transmits the reference voltage VREFP and the reference voltage VREFN to the chip connecting device 145. In some embodiments, the package device 150 transmits the reference voltage VREFP and the reference voltage VREFN to the chip connecting device 145 through the bump array 141 described above.

Then, in the operation S809, the chip connecting device 145 outputs the supply voltage VP1 and the supply voltage VN1 to the circuit device 160 based on the received reference voltages VREFP and VREFN. As such, the operations of the transmission from the power supply device 120 to the circuit device 160 are accomplished.

The description of the power delivery method 800 described above includes exemplary operations, but the operations of the power delivery method 800 do not need to be performed in the order as shown. The order of the operations of the power delivery method 800 may be changed, or the operations may be performed simultaneously, partially simultaneously, repeatedly, or omitted without departing from the scope or spirit of embodiments of the present disclosure.

Although the present application has been described in considerable detail with reference to certain embodiments thereof, it is not used to limit the present application. It will be apparent to those skilled in the art that various modifications and variations may be made without departing from the scope or spirit of the present application. Thus, the scope of the present application falls within the scope of the following claims.

What is claimed is:

1. A power delivery device, comprising:
a printed circuit board configured to receive a first reference voltage and a second reference voltage;
a package device coupled to the printed circuit board, wherein the package device comprises a bump array; and
a chip connecting device coupled to the bump array of the package device, and configured to output a first supply voltage and a second supply voltage,
wherein the bump array comprises:
 a plurality of first bumps configured to transmit the first reference voltage; and
 a plurality of second bumps configured to transmit the second reference voltage,
 wherein the plurality of first bumps and the plurality of second bumps are disposed in parallel, and
wherein the printed circuit board comprises:
 a first conductive plate configured to receive the first reference voltage; and
 a second conductive plate configured to receive the second reference voltage, the first conductive plate is disposed on an outside of a bottom surface of the printed circuit board, and the second conductive plate is disposed on an inside of the bottom surface of the printed circuit board with the first conductive plate, wherein the second conductive plate is substantially overlaps the first conductive plate, wherein the first conductive plate and the second conductive plate form a first parallel plate capacitor and a voltage between first conductive plate and the second conductive plate is at a system ground level.

2. The power delivery device of claim 1, further comprising a plurality of conductive balls coupled between the printed circuit board and the package device, wherein the printed circuit board comprises:
a first via coupled to a first conductive ball of the plurality of conductive balls, and configured to transmit the first reference voltage to the first conductive ball;
a second via coupled to a second conductive ball of the plurality of conductive balls, and configured to transmit the second reference voltage to the second conductive ball; and
a capacitor device coupled between the first via and the second via.

3. The power delivery device of claim 2, wherein the capacitor device comprises a plurality of capacitors disposed in parallel with each other.

4. The power delivery device of claim 1, wherein the printed circuit board further comprises:
a first ferrite bead coupled to the first conductive plate, wherein the first conductive plate is configured to receive the first reference voltage through the first ferrite bead; and
a second ferrite bead coupled to the second conductive plate, wherein the second conductive plate is configured to receive the second reference voltage through the second ferrite bead.

5. The power delivery device of claim 4, wherein the printed circuit board further comprises:
a third conductive plate configured to receive the first reference voltage;
a fourth conductive plate configured to receive the second reference voltage;
a third ferrite bead coupled to the third conductive plate, wherein the third conductive plate is configured to receive the first reference voltage through the third ferrite bead;
a fourth ferrite bead coupled to the fourth conductive plate, wherein the fourth conductive plate is configured to receive the second reference voltage through the fourth ferrite bead;
a first reference conductive plate coupled to the first conductive plate and the third conductive plate through the first ferrite bead and the third ferrite bead, respectively; and
a second reference conductive plate coupled to the second conductive plate and the fourth conductive plate through the second ferrite bead and the fourth ferrite bead, respectively,
wherein the third conductive plate is disposed on the bottom surface of the printed circuit board, the fourth conductive plate is disposed between the bottom surface and a top surface of the printed circuit board, and substantially overlaps the third conductive plate, wherein the third conductive plate and the fourth conductive plate form a second parallel plate capacitor, and
wherein the first reference conductive plate is disposed on the bottom surface of the printed circuit board, the second reference conductive plate is disposed between the bottom surface and the top surface of the printed circuit board, and substantially overlaps the first reference conductive plate, wherein the first reference conductive plate and the second reference conductive plate form a third parallel plate capacitor.

6. A power delivery method, comprising:
transmitting at least one reference voltage to a power delivery device through a power supply device;
receiving, by a printed circuit board in the power delivery device, the at least one reference voltage;
transmitting, by the printed circuit board, the at least one reference voltage to at least one conductive ball;
receiving, by the package device, the at least one reference voltage through the at least one conductive ball, and transmitting, by the package device, the at least one reference voltage to a chip connecting device; and
outputting, by the chip connecting device, at least one supply voltage to a circuit device based on the received at least one reference voltage,
wherein the printed circuit board comprises:
 a first conductive plate configured to receive the at least one reference voltage; and
 a second conductive plate configured to receive the at least one reference voltage, the first conductive plate is disposed on an outside of a bottom surface of the printed circuit board, and the second conductive plate is disposed on an inside of the bottom surface of the printed circuit board with the first conductive plate, wherein the first conductive plate and the second conductive plate form at least one capacitor device, wherein the second conductive plate is substantially overlaps the first conductive plate, wherein the first conductive plate and the second conductive plate form a first parallel plate capacitor and a voltage between first conductive plate and the second conductive plate is at a system ground level.

7. The power delivery method of claim 6, wherein transmitting, by the printed circuit board, the at least one reference voltage to at least one conductive ball comprises:
   transmitting, by the printed circuit board, the at least one reference voltage to at least one conductive ball through at least one via in the printed circuit board.

8. The power delivery method of claim 6, wherein transmitting, by the package device, the at least one reference voltage to the chip connecting device comprises:
   transmitting, by the package device, the at least one reference voltage to the chip connecting device through a bump array.

9. The power delivery method of claim 6, further comprising:
   decoupling, by the at least one capacitor device in the printed circuit board, the at least one reference voltage.

* * * * *